(12) United States Patent
Yano et al.

(10) Patent No.: US 9,241,383 B2
(45) Date of Patent: Jan. 19, 2016

(54) LIGHT-EMITTING DEVICE

(75) Inventors: Takakazu Yano, Tokyo (JP); Akio Yoshimura, Yamanashi-ken (JP); Sadato Imai, Yamanashi-ken (JP); Shinichi Miyashita, Yamanashi-ken (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 252 days.

(21) Appl. No.: 13/822,792

(22) PCT Filed: Dec. 29, 2011

(86) PCT No.: PCT/JP2011/007369
§ 371 (c)(1),
(2), (4) Date: Mar. 21, 2013

(87) PCT Pub. No.: WO2012/090509
PCT Pub. Date: Jul. 5, 2012

(65) Prior Publication Data
US 2013/0264958 A1    Oct. 10, 2013

(30) Foreign Application Priority Data

Dec. 29, 2010  (JP) ................................ 2010-294507

(51) Int. Cl.
*H05B 37/00*    (2006.01)
*H05B 33/08*    (2006.01)
(Continued)

(52) U.S. Cl.
CPC .............. *H05B 33/0839* (2013.01); *F21K 9/00* (2013.01); *H05B 33/0821* (2013.01); *H05B 33/0824* (2013.01); *H01L 25/0753* (2013.01); *H01L 2924/0002* (2013.01); *H05B 33/0806* (2013.01)

(58) Field of Classification Search
CPC ........... H05B 33/0821; H05B 33/0839; H05B 33/0842
USPC .......................... 315/193, 250, 313, 320, 362
See application file for complete search history.

(56) References Cited

U.S. PATENT DOCUMENTS 8,040,071 B2 * 10/2011 Lin et al. ....................... 315/224
8,076,872 B2 * 12/2011 Sauerlander et al. ......... 315/362
(Continued)

FOREIGN PATENT DOCUMENTS

JP    2005-183721    7/2005
JP    2006-147933    6/2006
(Continued)

OTHER PUBLICATIONS

International Search Report issued Nov. 20, 2012 in International (PCT) Application No. PCT/JP2011/007369.
(Continued)

*Primary Examiner* — William Hernandez
(74) *Attorney, Agent, or Firm* — Wenderoth, Lind & Ponack, L.L.P.

(57) ABSTRACT

A light-emitting device (10) includes a plurality of light-emitting areas (10a, 10b and 10c), and each of the light-emitting areas (10a, 10b and 10c) includes a first light-emitting block (3) and a second light-emitting block (4). Each respective first light-emitting blocks (3) include a plurality of first light-emitting elements (A1, A2, or A3), which are connected in series, and each respective second light-emitting blocks (4) include a plurality of second light-emitting elements (B1, B2, or B3), which are connected in series. The number of first light-emitting elements in each respective first light-emitting blocks (3) is the same with one another of the first light-emitting blocks (3), and the number of second light-emitting elements in each respective second light-emitting blocks (4) is the same with one another of the second light-emitting blocks (4).

18 Claims, 10 Drawing Sheets

(51) Int. Cl.
    *F21K 99/00*     (2010.01)
    *H01L 25/075*     (2006.01)

(56) References Cited

U.S. PATENT DOCUMENTS

| | | | |
|---|---|---|---|
| 8,384,311 B2* | 2/2013 | Gray et al. | 315/307 |
| 2010/0231135 A1* | 9/2010 | Hum et al. | 315/250 |
| 2010/0308738 A1* | 12/2010 | Shteynberg et al. | 315/185 R |
| 2010/0308743 A1* | 12/2010 | Liang et al. | 315/253 |
| 2011/0089844 A1* | 4/2011 | Grajcar | 315/193 |
| 2011/0227490 A1* | 9/2011 | Huynh | 315/185 R |

FOREIGN PATENT DOCUMENTS

| | | |
|---|---|---|
| JP | 2006-244848 | 9/2006 |
| JP | 2007-258459 | 10/2007 |
| JP | 2008-004415 | 1/2008 |
| JP | 2009-205850 | 9/2009 |
| JP | 2010-225413 | 10/2010 |

OTHER PUBLICATIONS

Written Opinion of the International Searching Authority issued Nov. 20, 2012 in International (PCT) Application No. PCT/JP2011/007369.

English Machine Translation of JP 2005-183721 having a publication date of Jul. 7, 2005.

English Machine Translation of JP 2010-225413 having a publication date of Oct. 7, 2010.

English Machine Translation of JP 2009-205850 having a publication date of Sep. 10, 2009.

English Machine Translation of JP 2007-258459 having a publication date of Oct. 4, 2007.

Notice of Reasons for Refusal issued Jul. 13, 2015 in corresponding Japanese Application No. 2013-529250 (with English translation).

\* cited by examiner

Fig. 3-A
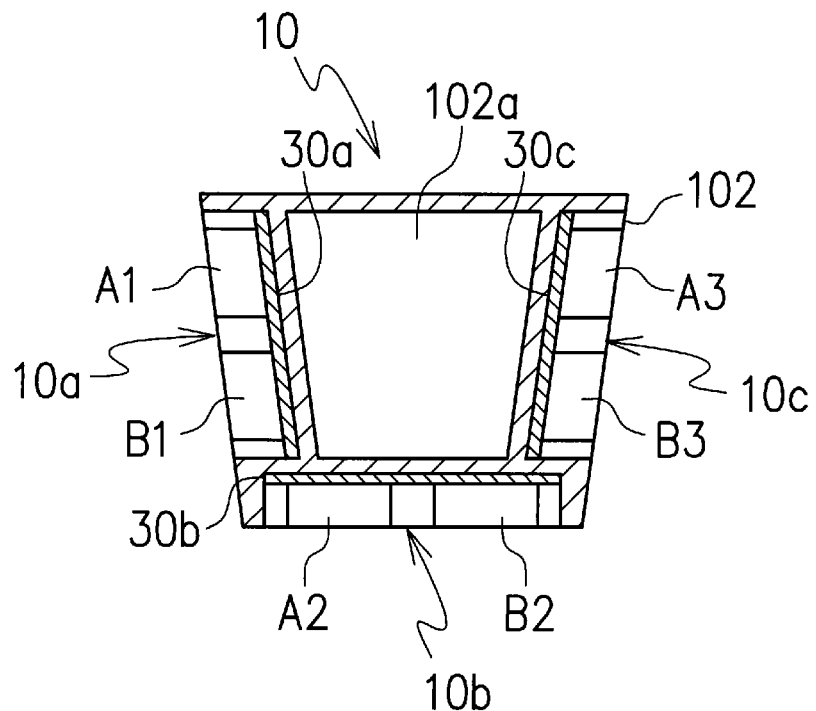
Fig. 3-B
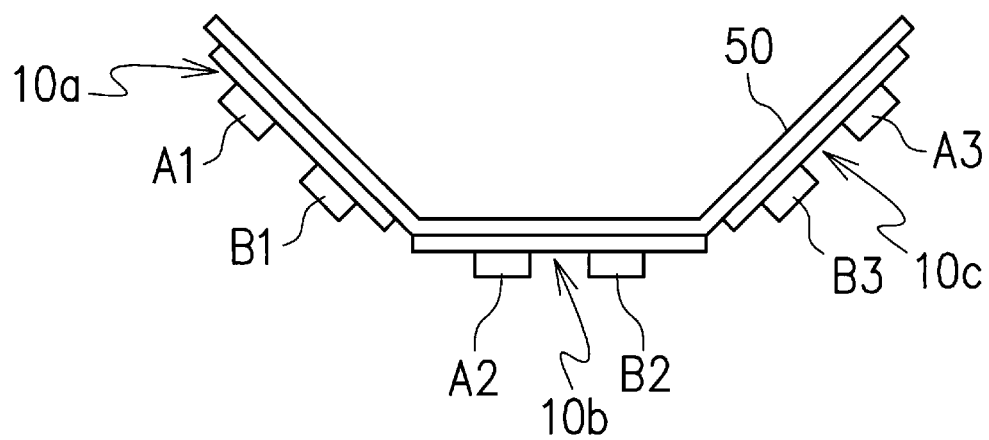

Fig. 5-A
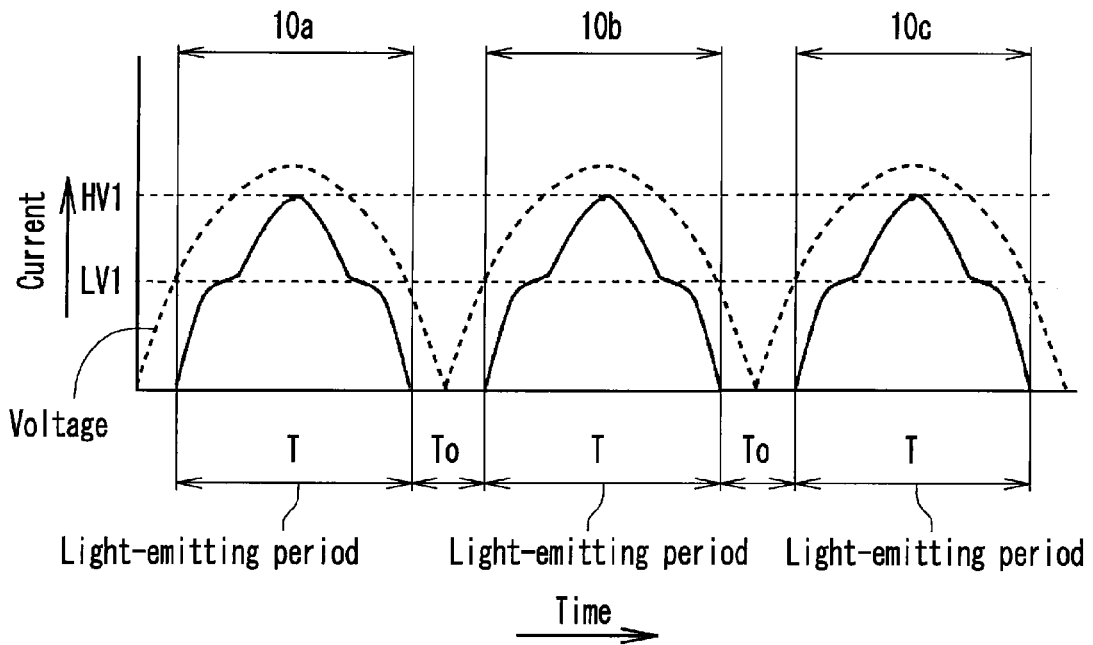
Fig. 5-B
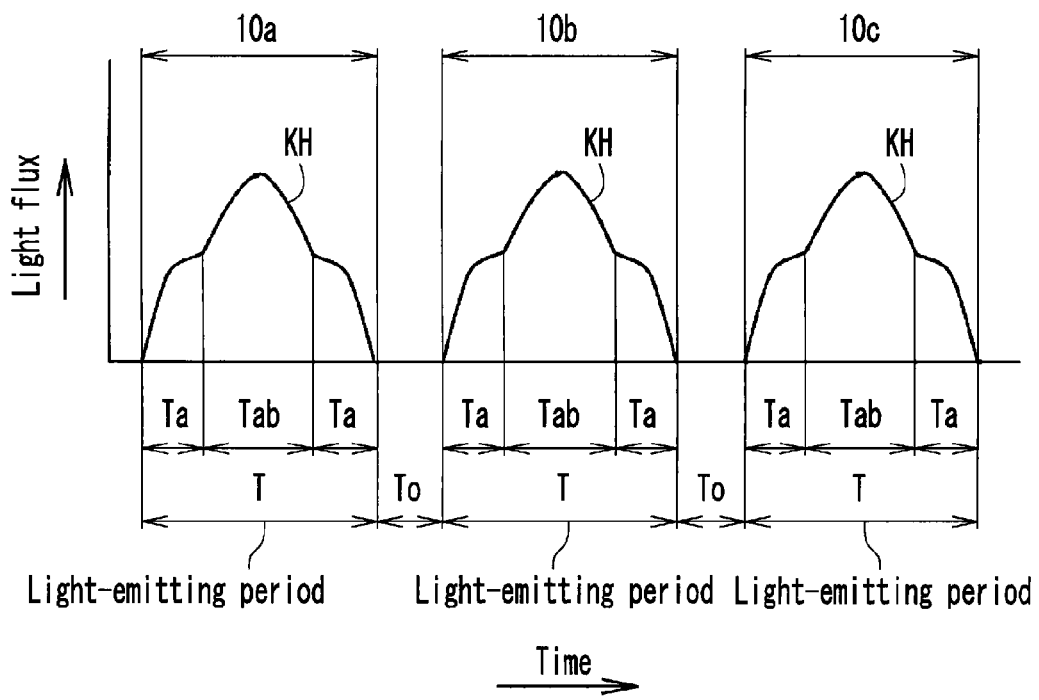

LIGHT-EMITTING DEVICE

TECHNICAL FIELD

The present invention relates to a light-emitting device, more specifically, to a light-emitting device using semiconductor light-emitting elements which are driven by the voltage that is rectified from an alternating-current (AC) voltage.

BACKGROUND ART

In recent years, light-emitting diode elements (referred to as LED elements) have widely been used for a backlight of a color display, illumination or the like, because the LED elements are semi-conductor light-emitting elements and have a long service life and excellent driving characteristic, and further have a high light-emitting efficiency and bright light-emitting color.

In particular, recently, there are widely adopted light-emitting devices including LED elements that are electrically connected in series and driven by the voltage rectified from the AC voltage. The number of LED elements connected in series are switched, depending on a voltage level or current level of the voltage that is rectified from the AC voltage of an AC power source.

As a method for utilization of an illumination device, if a plurality of LED elements are connected in series, because a combination of LED elements has flexibility and a degree of freedom in shape, it is proposed to use the combination for an advertisement or decoration by deforming the combination (for reference, see PTL 1).

A conventional light-emitting device as disclosed in PTL 1 is described hereinafter with reference to FIG. 10.

The conventional light-emitting device includes a plurality of light-emitting blocks C1 to C7. Each of the light-emitting blocks includes two to four LED elements which are connected in series. The light-emitting blocks C1 to C7 are arranged in any shape to display a character and so on.

An object of the conventional light-emitting device is to display information, such as a character, a sign in an advertisement and a decoration, by properly arranging a plurality of light-emitting blocks. The conventional light-emitting device discloses a structure with a changeable length of connecting light-emitting blocks that are connectable to a standard light-emitting block. However, it does not disclose a light-emitting area including a first light-emitting element and a second light-emitting element to be lit separately or together in accordance with a voltage value change due to an alternate current, a drive condition, light-emitting intensity and so on of the light-emitting blocks are not at all disclosed.

CITATION LIST

Patent Literature

[PTL 1] Japanese Patent Application Publication No. 2005-183721

SUMMARY OF INVENTION

Technical Problem

As the conventional light-emitting device, it does not disclose a light-emitting device including a plurality of light-emitting areas that can emit uniform light from each respective light-emitting areas of the light-emitting device, even if light-emitting elements included in the light-emitting device are driven by the voltage rectified from an AC voltage that continuously changes from low value to high value and from high value to low value like a continuous wave.

Solution to Problem

Accordingly, the invention provides a light-emitting device including a plurality of light-emitting areas each with a first light-emitting block and a second light-emitting block. The first light-emitting block, in each of the light-emitting areas, including first light-emitting elements, will start to emit light when the voltage reaches a first voltage value. The second light-emitting block, in each of the light-emitting areas, including second light-emitting elements, will start to emit light when the voltage reaches a second voltage value that is set higher than the first voltage value. The first light-emitting elements in the first light-emitting blocks will continue to emit light while the voltage value surpasses the first voltage value. For, example, a light-emitting device includes a plurality of light-emitting areas each including a first light-emitting block and a second light-emitting block, and the plurality of first light-emitting blocks each include a plurality of first light-emitting elements, and the plurality of second light-emitting blocks each include a plurality of second light-emitting elements.

The light-emitting device further includes a control circuit that includes at least one switch switching a voltage supply to the first light-emitting elements in the plurality of light-emitting areas or to the second light-emitting elements in the plurality of light-emitting areas as well as the first light-emitting elements in the plurality of light-emitting areas. If the control circuit includes two switches, a first switch is configured to switch a voltage supply to the first light-emitting elements in the first light-emitting blocks of the plurality of light-emitting areas and a second switch is configured to switch the voltage supply to the second light-emitting elements in the second light-emitting blocks of the plurality of light-emitting areas as well as the first light-emitting elements in the first light-emitting blocks of the plurality of light-emitting areas.

The control circuit is configured to detect value of voltage rectified from an AC voltage of the AC power source and to switch the first switch to apply the voltage to the first light-emitting elements in the first light-emitting blocks when the voltage being supplied from the AC power source reaches a first voltage value, and the control circuit is configured to switch the second switch to apply the voltage to the second light-emitting elements of the second light-emitting blocks as well as the first light-emitting elements in the first light-emitting blocks when the voltage being supplied from the AC power source reaches a second voltage value that is set higher than the first voltage value.

The first light-emitting blocks each include a same number of the first light-emitting elements. The second light-emitting blocks each include a same number of the second light-emitting elements. The light-emitting device includes light-emitting areas. The light-emitting areas each include the first light-emitting block and the second light-emitting block, and thus, light emitted from each of the light-emitting areas of the light-emitting device appear to be uniform even if a voltage value that is applied to the light-emitting device changes due to an alternate current.

Advantageous Effects Invention

Though the first light-emitting elements and the second light-emitting elements are driven by the voltage rectified from an AC voltage that continuously changes from low value to high value and from high value to low value like a continuous wave, as each respective light-emitting areas include the first light-emitting block and the second light-emitting block, the light-emitting areas can emit uniform light in accordance with the value of voltage that changes continuously. Also, the light-emitting device with simple electrical connection can be proposed.

BRIEF DESCRIPTION OF DRAWINGS

FIG. 3-A is a sectional view taken along line A-A of the light-emitting device as shown in FIG. 1.

FIG. 3-B is a schematic view showing a modified example of an arrangement of the light-emitting areas.

FIG. 5-A is a wave shape view showing a relationship a current and a light-emitting time of the light-emitting areas in the light-emitting device as shown in FIG. 1.

FIG. 5-B is a wave shape view showing a relationship a light flux and a light-emitting time of the light-emitting areas in the light-emitting device as shown in FIG. 1.

DESCRIPTION OF EMBODIMENTS

Figure 1:
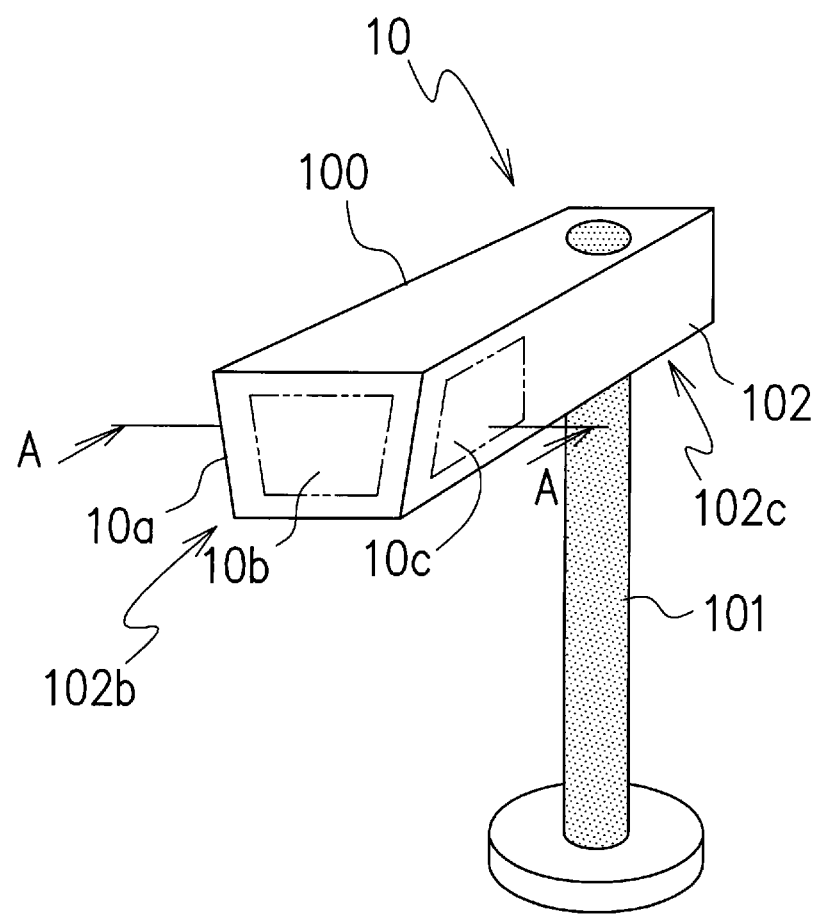
FIG. 1 is a perspective view showing a light-emitting device according to a first embodiment of the present invention.

Preferred embodiments of the present invention will be explained hereinafter in detail with reference to the accompanying drawings. Here, we call a semiconductor light-emitting element including a light-emitting diode element as light-emitting element.

First Embodiment

FIGS. 1 to 5 illustrate a light-emitting device 10 according to a first embodiment of the present invention.

The light-emitting device 10 includes a first light-emitting area 10a that includes a first light-emitting block 3 and a second light-emitting block 4. The first light-emitting block 3 includes first light-emitting elements A1 that are electrically connected to one another of the first light-emitting elements A1 in the first light-emitting block 3 in series. The second light-emitting elements B1 in the second light-emitting block 4 are electrically connected to one another of the second light-emitting elements B1 in the second light-emitting block 4 in series.

The light-emitting device 10 also includes a control circuit 60 including a first switch 16a that switches a voltage supply rectified from an alternative current (AC) power source 12 to the first light-emitting elements A1, and the control circuit 60 includes a second switch 16b that switches the voltage supply rectified from the AC power source to the second light-emitting elements B1 as well as the first light-emitting elements A1.

Accordingly, the control circuit 60 includes a voltage level detecting circuit 15 that can be connected to the power source terminals 13a and 13b of a rectifier 13 and a switching circuit 16, and the control circuit 60 is configured to detect voltage value rectified from an AC voltage of the AC power source and to switch the first switch 16a to apply the voltage to the first light-emitting elements A1, A2, and A3 when the voltage being supplied from the power source 11 reaches a first voltage value LV1 and configured to switch the second switch 16b to apply the voltage to the second light-emitting elements B1 as well as the first light-emitting elements A1 when the voltage being supplied from the AC power source 12 reaches a second voltage value HV1 that is set higher than the first voltage value LV1. As AC power voltage changes its AC voltage value like a repeated wave, a rectifier 13 is used to rectify the AC voltage and to apply the voltage that is rectified by the rectifier 13 to light-emitting elements. With the first voltage value LV1 and the second voltage value HV1 set, a plurality of light-emitting areas can emit light equally with one another of the light-emitting areas.

For more details, as AC power voltage and current rating differ by country, the first voltage value LV1 and the second voltage value HV1 should be set in consideration of the AC power voltage of a targeted country where the light-emitting device 10 will be used, a necessary number of light-emitting areas 10a, 10b, 10c, and more, the number of the first light-emitting elements A1, and the number of the second light-emitting elements B1. For example, in many of European countries, AC power voltage is around 220V. Also, a light-emitting element generally requires around 3V to emit light. In this case, if a light-emitting device 10 includes five light-emitting areas, the total number of the first light-emitting elements could be 30 and the total number of the second light-emitting elements could be 20 that are divided into the five light-emitting areas each with six first-light-emitting elements and four second-light-emitting elements. In this case, the first voltage value LV1 is set to be 90V (3V*6*5), and the second voltage value HV1 is set to be 150V (3V*6*5+ 3V*4*5).

In other words, when the voltage being supplied from the AC power source reaches the first voltage value LV1 (in this case, the first voltage value is 90V), the first light-emitting elements A1 in the first light-emitting blocks of the five light-emitting areas start to emit light, and when the voltage value being supplied from the AC power source reaches the second voltage value HV1 (in this case, the second voltage value is 150V), the second light-emitting elements in the second light-emitting blocks of the five light-emitting areas start to emit light. The first light-emitting elements are lit while the voltage being supplied from the AC power source is at and above 90V, and the second light-emitting elements B1 are lit while the voltage being supplied from the AC power source is at and above 150V. As mentioned above, though the first voltage value LV1 and the second voltage value HV1 change in accordance with a targeted country's AC power voltage, the number of light-emitting areas, and the total number of the first light-emitting elements and the total number of the second light-emitting elements, they can be set in consideration of above mentioned conditions.

Getting back to the explanation of first embodiment as shown in FIGS. 1 to 5, there are three light-emitting areas; a first light-emitting area 10a, a second light-emitting area 10b, and a third light-emitting area 10c. In this embodiment, a first light-emitting block 3 and a second light-emitting block 4 in each respective first light-emitting area 10a, second light-emitting area 10b and third light-emitting area 10c are arranged side by side. The first light-emitting area 10a further includes a first circuit substrate 30a at that the first light-emitting elements and the second light-emitting elements of the first light-emitting area 10a are mounted. Also, the second light-emitting area 10b includes a second circuit substrate 30b, and the first light-emitting elements A2 of the second light-emitting area are disposed at the second circuit substrate 30b and the second light-emitting elements B2 of the second light-emitting area are disposed at the second circuit substrate 30b. The third light-emitting area 10c includes a third circuit substrate 30c, and the first light-emitting elements A3 of the third light-emitting area are disposed at the third circuit substrate 30c and the second light-emitting elements B3 of the third light-emitting area 10c are disposed at the third circuit substrate 30c.

The number of the first light-emitting elements and the number of the second light-emitting elements are different from one another of the first light-emitting elements and the second light-emitting elements of each respective first, second, third, light-emitting areas. Also, the number of the first light-emitting elements in each of the first light-emitting area, the second light-emitting area, and the third light-emitting area is the same with one another of the first light-emitting area, the second light-emitting area, and the third light-emitting area, and the number of the second light-emitting elements in each of the first light-emitting area, the second light-emitting area, and the third light-emitting area is the same with one another of the first light-emitting area, the second light-emitting area, and the third light-emitting area.

The first light-emitting block 3 in each respective first light-emitting area 10a, second light-emitting area 10b and third light-emitting area 10c includes first light-emitting elements A1, A2, and A3, and the second light-emitting block 4 in each respective first light-emitting area 10a, second light-emitting area 10b and third light-emitting area 10c includes second light-emitting elements B1, B2, and B3.

Figure 2:
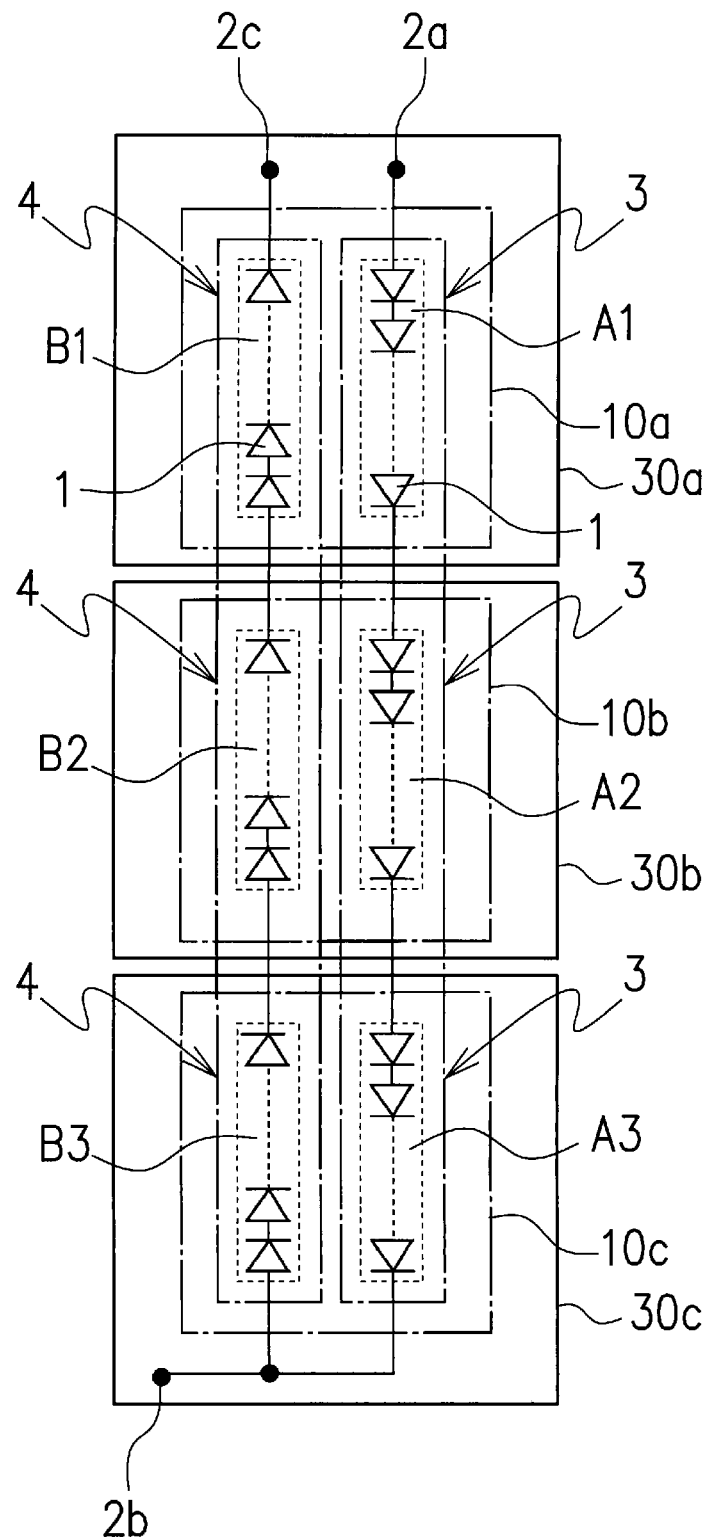
FIG. 2 is an arrangement view of a light-emitting block in each of light-emitting areas of the light-emitting device as shown in FIG. 1.
Figure 4:
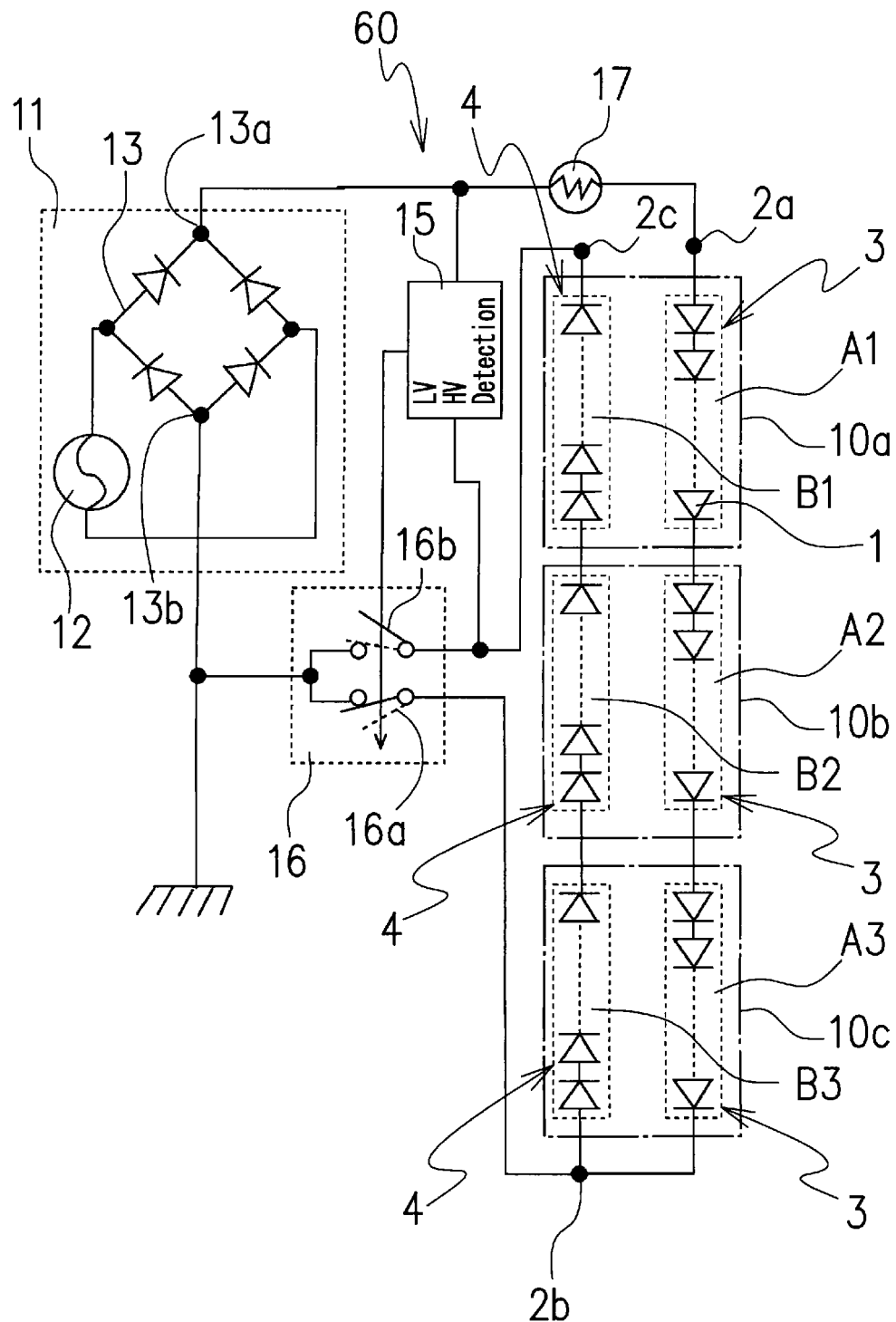
FIG. 4 is a system block view showing a control circuit of the light-emitting device as shown in FIG. 1.

As shown in FIGS. 2 and 4, the first light-emitting elements A1 of the first light-emitting area 10a are electrically connected in series to the first light-emitting elements A2 of the second light-emitting area 10b, the first light-emitting elements A2 of the second light emitting area 10b are electrically connected in series to the first light-emitting elements A3 of the third light-emitting area 10c, the first light-emitting elements A3 of the third light-emitting area 10c are electrically connected in series to the second light-emitting elements B3 of the third light-emitting area 10c, the second light-emitting elements B3 of the third light-emitting area 10c are electrically connected in series to the second light-emitting elements B2 of the second light-emitting area 10b, and the second light-emitting elements B2 of the second light-emitting area 10b are electrically connected in series to the second light-emitting elements B1 of the first light-emitting area.

In this electrical connection, only the first light-emitting elements can be lit while the voltage is low, and the second light-emitting elements as well as the first light-emitting elements can be lit through the control circuit including the switch that switches the voltage to the second light-emitting elements as well as the first light-emitting elements when the voltage being supplied from the AC power source reaches the second voltage value with a simple connection.

The light-emitting device 10 may further include a rectifier 13 that can be electrically connected to the AC power source 12 to rectify an AC voltage of the AC power source 12 and supply the voltage that is rectified to the first light-emitting elements and the second light-emitting elements through the control circuit.

In the first embodiment as shown in FIG. 1, the light-emitting device 10 can be used as a street light 100 as an example. The street light 100 includes a casing 102 that includes a first surface, a second surface, and a third surface, and the first light-emitting area 10a is disposed at the first surface of the casing 102, the second light-emitting area 10b is disposed at the second surface of the casing 102, and the third light-emitting area 10c is disposed at the third surface of the casing 102. The casing 102 may include a polyhedral shape with polyhedral surfaces. The casing 102 includes a space 102a inside the casing 102, a first end portion 102b at that the light-emitting areas 10a, 10b, and 10c are disposed, and a second end portion 102c. The first end portion 102b and the second end portion 102c are laterally opposite to each other. The casing 102 may further include a support 101 that supports the second end portion 102c of the casing 102. The casing 102 may have an inverted trapezoidal shape.

In the first embodiment (see FIGS. 1 and 3A), there are the first light-emitting area 10a, the second light-emitting area 10b and the third light-emitting area 10c are arranged at respective surfaces in the space 102a of the casing 102. The first light-emitting area 10a, the second light-emitting area 10b, and the third light-emitting area 10c may be arranged at, at least some of polyhedral surfaces of the casing 102 to emit light outside the casing 102 in different directions.

A first surface and the second surface of the casing 102 may be disposed with a first angle between the first surface and the second surface, and the second surface and the third surface of the casing 102 may be disposed with a second angle between the second surface and the third surface. The first angle and the second angle may be the same with each other or may be different from each other in accordance with the shape of the casing 102. Of course as the casing 102 has a polyhedral shape, a fourth surface or more surfaces may be provided for additional light-emitting areas 10a, 10b, and 10c.

As shown in FIG. 3A, the first light-emitting area 10a and the third light-emitting area 10c are attached to inner walls of right and left surfaces at the first end portion 102b of the casing 102, and the second light-emitting area 10b is attached to a front surface positioned between the inner walls of the right and left surfaces at the first end portion 102b of the casing 102. These first to third light-emitting areas 10a to 10c are configured to emit light in respective directions outside the casing 102. Accordingly, a street or a space can be illuminated widely. In addition, in the first embodiment, it is also possible to achieve a light-emitting device that also emits light downward with a fourth light-emitting area on a bottom surface positioned between the inner walls of the right and left surfaces in the first end portion 102b of the casing 102, for example.

FIGS. 3A and 3B illustrates a modified example of the first light-emitting area 10a including a first circuit substrate 30a, the second light-emitting area 10b including a second circuit substrate 30b and the third light-emitting area 10c including a third circuit substrate 30c. In the modified example, the first circuit substrate 30a, the second circuit substrate 30b and the third circuit substrate 30c are arranged on a metal plate 50 including three surfaces with a predetermined angle between respective adjacent surfaces of the three surfaces of the metal plate 50. The metal plate 50 can be arranged on a wall of a building and/or in such a casing 102 of a light-emitting device. In this way, the plurality of light-emitting areas 10a, 10b and 10c can be applied to various light-emitting devices and systems.

Meanwhile, the first light-emitting area 10a may include the first light-emitting block 3 and the second emitting block 4 arranged side by side, the second light-emitting area 10b may include the first light-emitting block 3 and the second emitting block 4 arranged side by side, and the third light-emitting area 10c may include the first light-emitting block 3 and the second emitting block 4 arranged side by side.

The first circuit substrate 30a may be provided on a first metal plate, the second circuit substrate 30b may be provided on a second metal plate and the third circuit substrate 30c may be provided on a third metal plate, separately. The first light-emitting elements A1 and the second light-emitting elements B1 of the first light-emitting area are mounted at the first circuit substrate 30a and thermally connected to the first metal plate, the first light-emitting elements A2 and the second light-emitting elements B2 of the second light-emitting area are mounted at the second circuit substrate 30b and thermally connected to the second metal plate, and the first light-emitting elements A3 and the second light-emitting elements B3 of the third light-emitting area are mounted at the third circuit substrate 30c and thermally connected to the third metal plate.

The first light-emitting block 3 and the second light-emitting block 4 are electrically connected to a first electrode 2a and a third electrode 2c which are provided on the circuit substrate 30a and a second electrode 2b which is provided on the circuit substrate 30c. The constitution is mentioned below.

Next, a control circuit and a drive method of a voltage level-switching system of the light-emitting device 10 are described with respect to FIG. 4.

FIG. 4 illustrates an example of electrical connection, showing a system block view of a control circuit including a first switch 16a and a second switch 16b. In FIG. 4, the first light-emitting block 3 and the second light-emitting block 4 are electrically connected in series to the first electrode 2a, the second electrode 2b, and the third electrode 2c.

The first light-emitting elements A1, A2, A3 of the first light-emitting blocks 3 are electrically connected in series to the first electrode 2a and the second electrode 2b. The second light-emitting elements B1, B2, B3 of the second light-emitting blocks 4 are electrically connected in series to the second electrode 2b and the third electrode 2c.

The control circuit 60 includes the first switch 16a that switches the voltage supply from the AC power source to the first light-emitting elements A1, A2, A3 and the second switch 16b, and the second switch 16b that switches the voltage supply from the AC power source 12 to the second light-emitting elements B1, B2, B3 as well as the first light-emitting elements A1, A2, A3. The control circuit 60 is configured to detect value of voltage rectified from an AC voltage of the AC power source 12 and to switch the first switch 16a to apply the voltage to the first light-emitting elements A1, A2, A3 when the voltage being supplied from the AC power source 12 reaches the first voltage value LV1, and the control circuit 60 is configured to switch the second switch 16b to apply the voltage to the second light-emitting elements B1, B2, B3 as well as the first light-emitting elements A1, A2, A3 when the voltage being supplied from the AC power source 12 reaches the second voltage value HV1 that is set higher than the first voltage value LV1.

The voltage is flowed from the first electrode 2a, through the first light-emitting elements A1, A2, A3 in the first light-emitting blocks 3 to the second electrode 2b during the voltage supply from the AC power source 12 remaining below the second voltage value HV1, and the control circuit 60 controls to apply the voltage to be flowed from the first electrode 2a, through the first light-emitting elements A1, A2, A3 in the first light-emitting blocks 3 to the second electrode 2b, and further through the second light-emitting elements B3, B2, B1 in the second light-emitting blocks 4 to the third electrode 2c.

Figure 8:
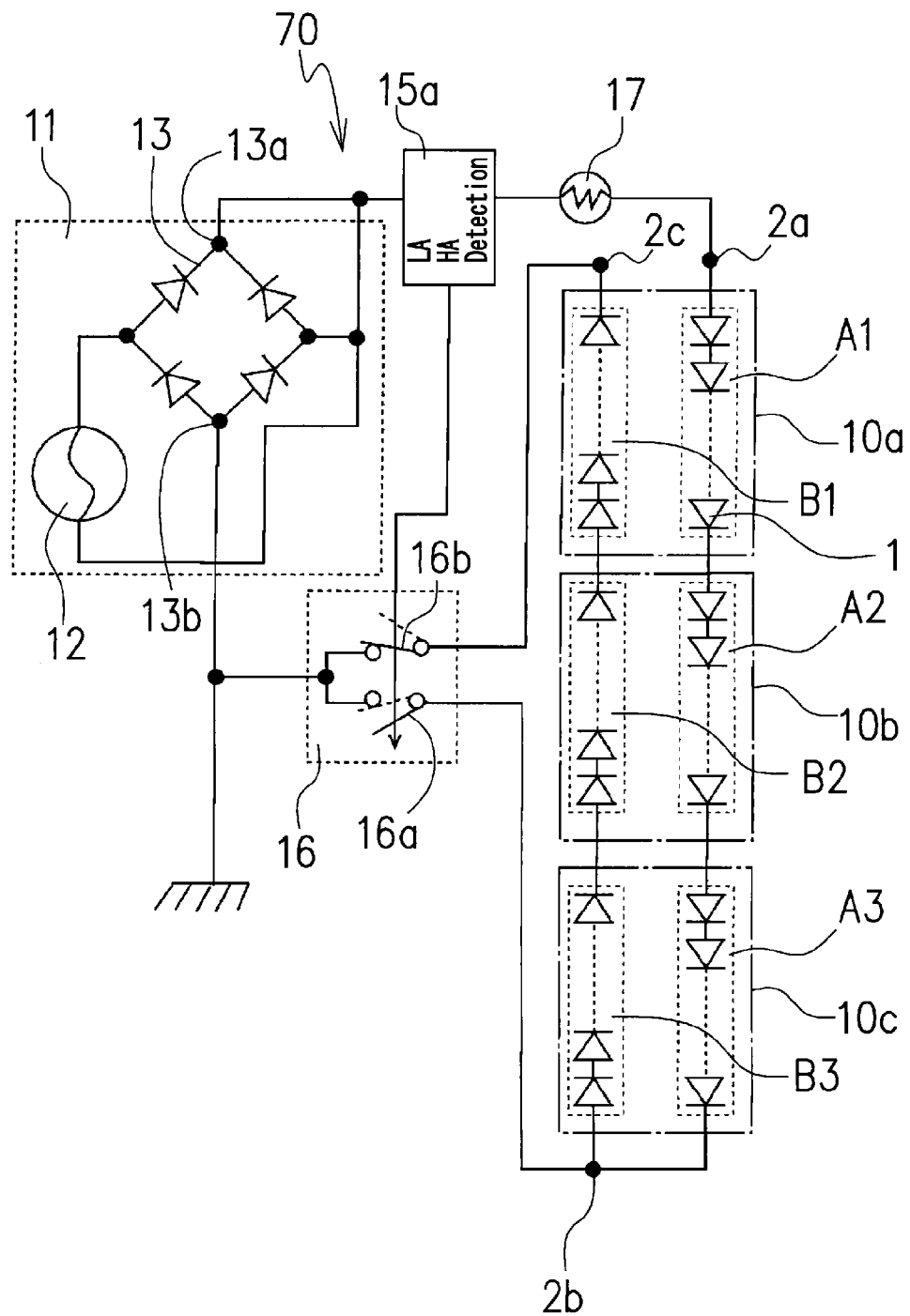
FIG. 8 is a system block view showing a control circuit of a light-emitting device according to a third embodiment of the present invention.
Figure 9:
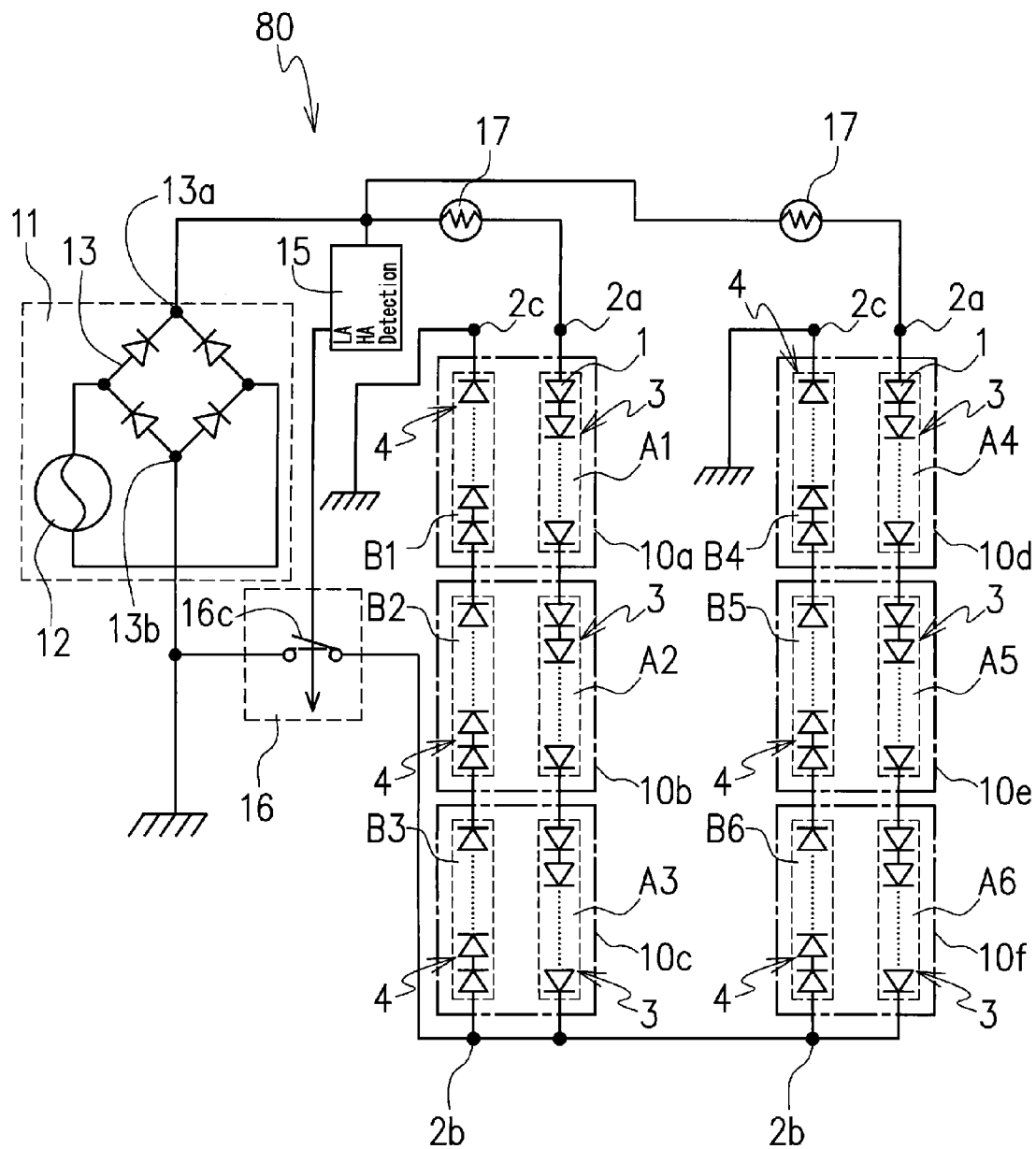
FIG. 9 is another system block view showing a control circuit of a light-emitting device according to a fourth embodiment of the present invention.
Figure 10:
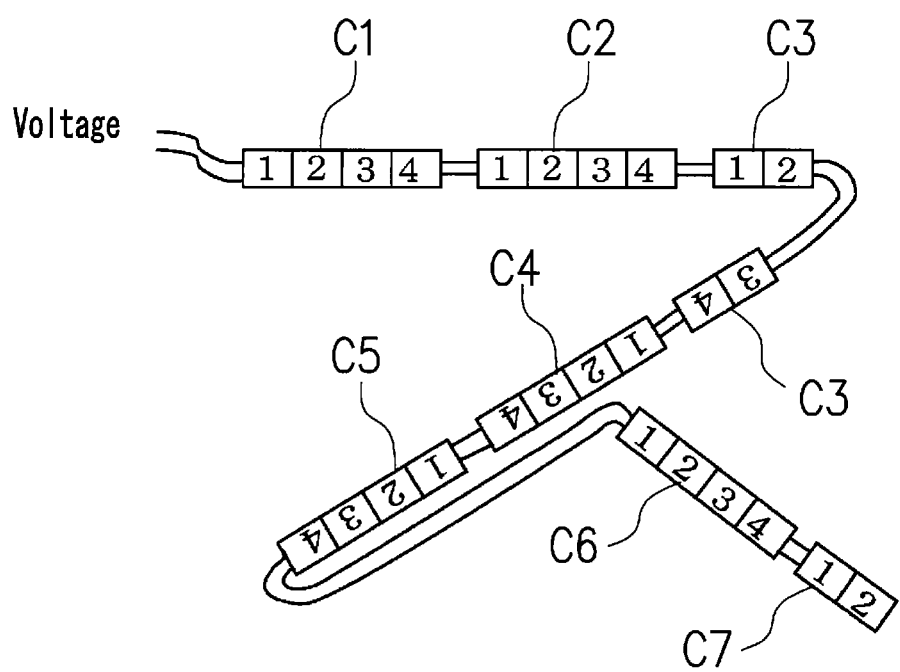
FIG. 10 is a plan view showing a conventional light-emitting device.

Though an AC (alternating-current) power source 12 is shown in the system blocks of FIGS. 4, 8, and 9, the AC power source 12 is not included in this light-emitting device 10. The AC power source 12 is basically located outside the light-emitting device 10, for example, in a building or a facility, and the light-emitting device 10 uses the voltage that is rectified from the AC voltage of the AC power source 12 to drive light-emitting elements. Accordingly, the light-emitting device 10 includes a rectifier 13 to rectify an AC voltage and supply a voltage that is rectified from the AC voltage to the first light-emitting elements and the second light-emitting elements through the control circuit 60. The rectifier 13 can perform full-wave rectification for a pulse wave signal (hereinafter referred to as AC voltage) to supply a rectified voltage or a DC voltage. In the first embodiment, as an example of the AC power source 12, with an AC power source of AC 120V and 60 Hz is explained.

In addition, the light-emitting device 10 includes a control circuit 60 that includes a voltage level detecting circuit 15 connected to the power source terminals 13a and 13b of the rectifier 13 and detects a value of AC voltage level (high voltage HV, low voltage LV). The control circuit 60 also includes a switching circuit 16 that includes a first switch 16a and a second switch 16b. The first switch 16a switches a voltage supply to the first light-emitting elements and the second switch 16b switches the voltage supply to the second light-emitting elements as well as the first light-emitting elements. The first switch 16a and the second switch 16b are configured to be switched by a detection signal of the voltage level detecting circuit 15 and is configured to switchably connect the second electrode 2b and the third electrode 2c to the power source terminal 13b of the rectifier 13. The power source terminal 13a of the rectifier 13 is connected through a current-limiting element 17 (for example, a resistive element) to the first electrode 2a.

Consequently, when the power source terminal 13b of the rectifier 13 is connected to the second electrode 2b, the first light-emitting block 3 is lighted, and in this state, when the power source terminal 13b of the rectifier 13 is connected to the third electrode 2c, the second light-emitting block 4 is lighted.

In the structure, while the voltage level detecting circuit 15 detects a low voltage level LV, the switching circuit 16 is maintained in a state where the first switch 16a is ON and the second switch 16b is OFF. On the other hand, while the voltage level detecting circuit 15 detects a high voltage level HV including a peak of the AC voltage supply, the switching circuit 16 is switched to a state where the first switch 16a is OFF and the second switch 16b is ON.

Consequently, while the voltage level detecting circuit 15 detects the low voltage level LV, a connection from the power source terminal 13a of the rectifier 13 through the current-limiting element 17 to the first electrode 2a of the light-emitting device 10 is established. A current flowing in the first light-emitting block 3 flows from the second electrode 2b to the power source terminal 13b of the rectifier 13 through the first switch 16a of the switching circuit 16, which is in a state of ON. That is to say, while the voltage level detecting circuit 15 detects the low voltage level LV, the first light-emitting block 3 is connected between the power source terminals 13a and 13b of the rectifier 13, thereby the first light-emitting elements A1, A2 and A3 constituting the first light-emitting block 3 are lighted. At this time, each of the three light-emitting areas 10a, 10b and 10c has the same light-emitting intensity, that is, brightness, because each of the first light-emitting elements A1, A2 and A3 has the same number of light-emitting elements, as mentioned above.

At a time that the AC voltage from the AC power source 12 is increased and the high voltage level HV including a peak of AC voltage supply is detected by the voltage level detecting circuit 15, when the switching circuit 16 is switched to a state where the first switch 16a is OFF and the second switch 16b is ON, the power source terminal 13a of the rectifier 13 is connected through the current-limiting element 17 to the first electrode 2a of the light-emitting device 10 and a current flowing in first light-emitting elements in the first light-emitting blocks 3 flows from the second electrode 2b into the second light-emitting elements in the second light-emitting blocks 4, and then flows from the third electrode 2c into the power source terminal 13b of the rectifier 13 through the second switch 16b that is in a state of ON.

That is to say, while the voltage level detecting circuit 15 detects a high voltage level HV, the first light-emitting block 3 and the second light-emitting block 4 are connected in series between the power source terminals 13a and 13b of the rectifier 13. Consequently, the first light-emitting elements A1, A2, and A3 in the first light-emitting blocks 3 and the second light-emitting elements B1, B2, and B3 in the second light-emitting blocks 4 are lighted. In this way, while the voltage level detecting circuit 15 detects the first voltage value that is the low voltage level LV1, the first light-emitting elements A1, A2 and A3 constituting the first light-emitting blocks 3 are lighted, and while the voltage level detecting circuit 15 detects the second voltage value that is high voltage level HV1 including a peak of the AC voltage supply, the second light-emitting elements B1, B2 and B3 constituting the second light-emitting blocks 4 are lighted, in addition to the first light-emitting elements A1, A2, and A3 in the first light-emitting blocks 3.

Here, because the number of the light-emitting elements constituting the first light-emitting elements A1, A2 and A3 and the number of the light-emitting elements constituting the second light-emitting elements B1, B2 and B3 are the same, light emitted from the first light-emitting elements A1, A2 and A3 and light emitted from the second light-emitting elements B1, B2 and B3 have the same brightness.

Next, a drive method of the light-emitting device 10 is explained in detail further with reference to wave shape views as shown in FIGS. 5A and 5B.

A light-emitting time of the first light-emitting block 3 depends on the number of the light-emitting elements 1 serially arranged in the first light-emitting block 3, and a light-emitting time of the second light-emitting block 4 depends on the number of the light-emitting elements serially arranged in the second light-emitting block 4. In the light-emitting device 10 in the first embodiment, the number of each of the first light-emitting elements A1, A2 and A3 in the first light-emitting block 3 is thirty (30), and the number of each of the second light-emitting elements B1, B2 and B3 in the second light-emitting block 4 is twenty (20).

An operation of the light-emitting device is described based on the aforementioned structure with reference to FIGS. 5A and 5B as follows.

FIG. 5A illustrates a drive current of each of the first light-emitting block 3 and the second light-emitting block 4, which are driven by the voltage rectified from an AC voltage. In FIG. 5A, a vertical axis shows a current and a horizontal axis shows a time. A wave shape shown by solid line shows a light-emitting period T in each of the first to third light-emitting areas 10a, 10b and 10c, and a wave shape shown by dotted line shows the voltage in each of the first to third light-emitting areas 10a, 10b and 10c. Further details are described with reference to FIG. 5B. The voltage wave shape repeats mountain-like pulse wave shape because the rectified voltage from the AC voltage is used, and until the detection level of the voltage level detecting circuit 15 as shown by the vertical axis reaches LV1, a current flows only the first light-emitting block 3. Consequently, only the first light-emitting block 3 is lighted at the first voltage value.

When the detection level is switched from LV1 to HV1, a current flows in the series connection between the first light-emitting block 3 and the second light-emitting block 4, thereby the first light-emitting block 3 and the second light-emitting block 4 are lighted. Here, a period in which the first light-emitting block 3 and the second light-emitting block 4 are lighted by a current flowing therein is the light-emitting period T. Because a current does not flow in the first light-emitting block 3 while the voltage is lower than a threshold voltage of the first light-emitting block 3, this period is a non-light-emitting period $T_0$ in which the light emission is not performed.

FIG. 5B illustrates a light-emitting wave shape KH of the each of the light-emitting areas 10a, 10b and 10c. Of the light-emitting period shown in FIG. 5A, in a period Ta at which a detection level by the voltage level detecting circuit 15 shown in FIG. 4 is LV, only the first light-emitting elements A1, A2 and A3 constituting the first light-emitting block 3 are lighted, and in a period Tab at which a detection level by the voltage level detecting circuit 15 is HV, the first light-emitting elements A1, A2 and A3 constituting the first light-emitting block 3 and the second light-emitting elements B1, B2 and B3 constituting the second light-emitting block 4 are lighted together. In this case, the light-emitting wave shape KH of each of the first to third light-emitting areas 10a, 10b and 10c has approximately the same shape as a wave shape of the drive current.

As mentioned above, in the switching drive system in case of the plurality of light-emitting elements connected in series, the light-emitting condition with respect to the plurality of light-emitting areas represents the constantly same light-emitting state and the same drive current flowing in each light-emitting element, regardless of the switching conditions due to the AC voltage of the AC power supply. Therefore, it is possible to provide a light-emitting device including a plurality of light-emitting areas with a simple electrical connection. Accordingly, the light-emitting device can have the light-emitting areas with uniform intensity of light and operating life maintained, even if the light-emitting elements in the light-emitting device will be driven by the voltage rectified from an AC voltage.

Second Embodiment

A light-emitting device according to a second embodiment of the present invention is described with reference to FIGS. 6 and 7.

Figure 6:
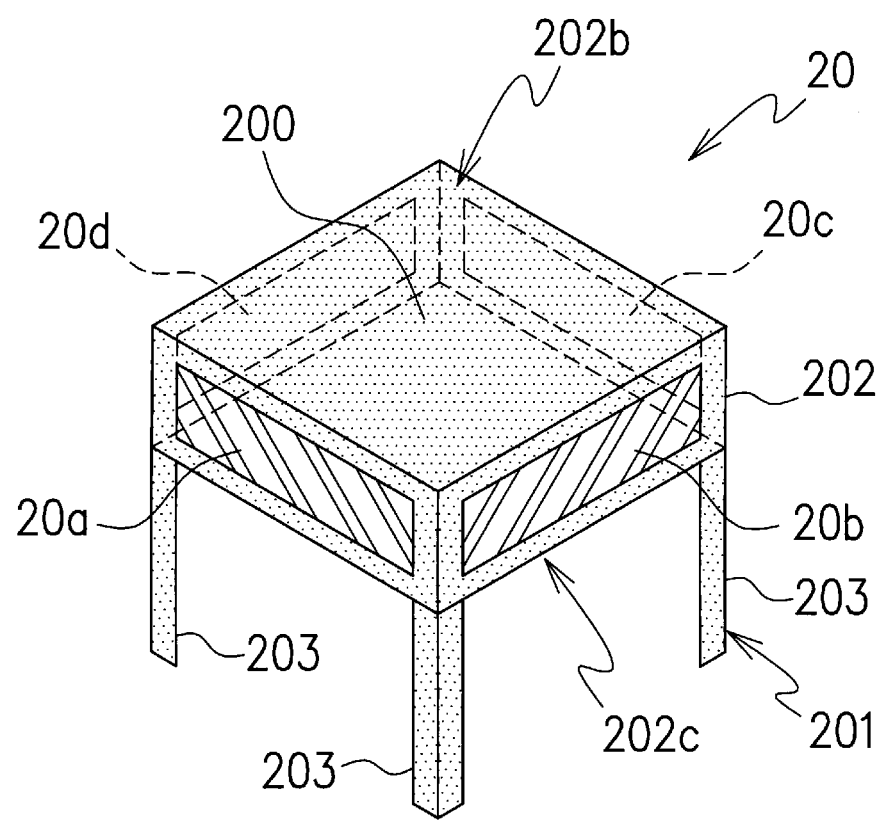
FIG. 6 is a perspective view of a light-emitting device according to a second embodiment of the present invention.

As shown in FIG. 6, the light-emitting device 20 includes a support 201, and a casing 202 provided on an upper end of the support 201 and including a first end portion 202b and a second end portion 202c vertically opposite to each other, and peripheral surfaces between the first end portion 202b and the second end portion 202c. The light-emitting areas 20a, 20b, 20c and 20d are disposed at, at least some of the peripheral surfaces of the casing 202. The support supports the casing at the second end portion 202c. The support may include a plurality of pillars 203.

FIG. 6 illustrates an example in which the light-emitting device 20 according to the present invention is applied to an illumination device 200 set in a building or outside. The illumination device 200 has a square shape and includes four surfaces at a circumference of the device. First light-emitting area 20a, second light-emitting area 20b, third light-emitting area 20c and fourth light-emitting area 20d are arranged on the four surfaces of the illumination device, respectively.

Figure 7:
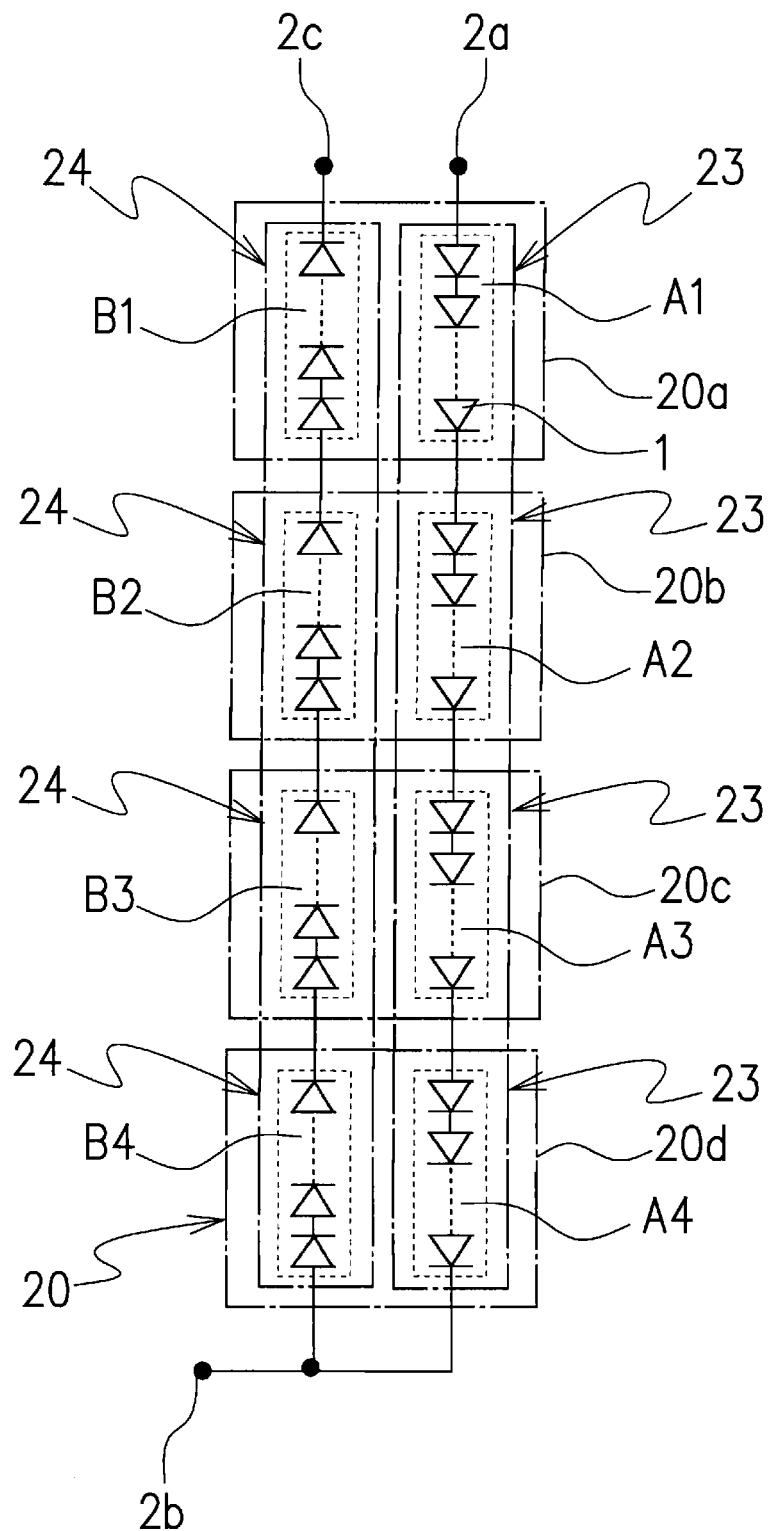
FIG. 7 is an arrangement view of a light-emitting block in each of light-emitting areas of the light-emitting device as shown in FIG. 6.

FIG. 7 illustrates a first light-emitting block 23 and a second light-emitting block 24 in the light-emitting device 20. The light-emitting device 20 in the second embodiment has the same basic structure as the light-emitting device 10 in the first embodiment. Accordingly, only a difference of the light-emitting device in the second embodiment from the light-emitting device according to the first embodiment is explained.

That is to say, the light-emitting device 20 in the second embodiment differs from the light-emitting device 10 in the first embodiment in that the light-emitting device 20 includes four light-emitting areas 20a, 20b, 20c and 20d, as shown in FIGS. 6 and 7. Consequently, in the light-emitting device 20 according to the second embodiment, the first light-emitting block 23 includes four first light-emitting elements A1, A2, A3 and A4, and the second light-emitting block 24 includes four second light-emitting elements B1, B2, B3 and B4.

Here, it is important that each of the first light-emitting elements A1, A2, A3 and A4 constituting the first light-emitting block 23 has the same number of light-emitting elements 1, and each of the second light-emitting elements B1, B2, B3 and B4 constituting the second light-emitting block 24 has the same number of light-emitting elements 1.

Accordingly, each of the first and second light-emitting elements A1 and B1 arranged in the first light-emitting area 20a, the first and second light-emitting elements A2 and B2 arranged in the second light-emitting area 20b, the first and second light-emitting elements A3 and B3 arranged in the third light-emitting area 20c, and the first and second light-emitting elements A4 and B4 arranged in the fourth light-emitting area 20d is formed by the same number of light-emitting elements 1.

In other words, each of the first light-emitting elements A1, A2, A3 and A4 and the second light-emitting elements B1, B2, B3 and B4 in the light-emitting areas 20a, 20b, 20c and 20d is configured by the same number and the same arrangement of the light-emitting elements 1.

Consequently, if the light-emitting device 20 according to the second embodiment is driven by the same drive circuit as that in the first embodiment, as shown in FIG. 4, a light-emitting wave shape KH of each of the light-emitting areas 20a, 20b, 20c and 20d has approximately the same shape as a wave shape of a drive current, similarly to the wave shape views shown in FIGS. 5A and 5B.

Accordingly, similarly to the light-emitting areas 10a, 10b and 10c in the first embodiment, in the switching drive system by the AC power supply in case of the plurality of light-emitting elements connected in series, the light-emitting condition with respect to the plurality of light-emitting areas indicates the constantly same light-emitting state and the same drive current flowing in each light-emitting element, regardless of the switching conditions of the AC power supply. Therefore, it is possible to provide a light-emitting device in which there is no difference in the drive condition, thereby the same illumination effect and the same operating life are maintained.

Third Embodiment

Next, a light-emitting device according to a third embodiment of the present invention is explained with reference to FIG. 8.

The light-emitting device in the third embodiment has a structure adapted to drive the aforementioned light-emitting device 10 by a voltage level-switching system. FIG. 8 illustrates a system of a drive circuit of the light-emitting device 10. Because a control circuit 70 as shown in FIG. 8 is basically the same as the control circuit 60 shown in FIG. 4, in the light-emitting device in the third embodiment, identical reference numbers are attached to similar parts to that in the light-emitting device 10 in the first embodiment, as a result, a duplicated description thereof is omitted.

The control circuit as shown in FIG. 8 differs from the control circuit as shown in FIG. 4 in the following points. In the control circuit 60 of the voltage level-switching system, as shown in FIG. 4, the switching circuit 16 to perform the switching connection of the first light-emitting block 3 and the second light-emitting block 4 is controlled based on the voltage level detection of the voltage level detecting circuit 15, but in the control circuit 70 of the current level-switching system as shown in FIG. 8, the control circuit 70 is controlled based on the current level detection of a current level detecting circuit 15a. In other words, the current level detecting circuit 15a controls a current based on the detection signal of the current level LA, HA to perform light-emitting operation of the light-emitting device 10.

Fourth Embodiment

Furthermore, the light-emitting device 10 with more light-emitting areas can be provided with a simple electrical connection. As shown in FIG. 9, there are six light-emitting areas 10a-10f each with a first light-emitting block 3 and a second light-emitting block 4. As a light-emitting device, the light-emitting device includes the plurality of light-emitting areas 10a-10f each including a first light-emitting block 3 and a second light-emitting block 4. The plurality of first light-emitting blocks 3 each include a plurality of first light-emitting elements A1, A2, A3, A4, A5 or A6, and the plurality of second light-emitting blocks 4 each include a plurality of second light-emitting elements B1, B2, B3, B4, B5 or B6.

The light-emitting device further includes a control circuit 80 that including a single switch 16c that switches a voltage to the first light-emitting elements A1 -A6 and to the second light-emitting elements B1-B6. The voltage rectified from the AC power source 12 by a rectifier 13 is applied to the first light-emitting elements A1 -A6 that are configured to start light at a first voltage value LV1, and the control circuit 80 is configured to switch the single switch 16c to apply the voltage to the second light-emitting elements B1 -B6 as well as the first light-emitting elements A1-A6 when the voltage reaches a second voltage value HV1 that is set higher than the first voltage value LV1.

Accordingly, the control circuit 80 includes a voltage level detecting circuit 15 that can be connected to the power source terminals 13a and 13b of the rectifier 13 and a switching circuit 16 including the single switch 16c. The first light-emitting elements in the first light-emitting block of each respective first light-emitting areas are electrically connected to one another of the first light-emitting elements in the first light-emitting block 3 in series, and the second light-emitting elements in the second light-emitting block 4 of each respective first light-emitting areas electrically connected to one another of the second light-emitting elements in the second light-emitting block 4 in series.

Even if the number of the light-emitting areas increases, the simple electrical connection can be applied to the light-emitting device with more light-emitting areas. In other words, the first light-emitting elements (A1 or A4) of the first light-emitting area (10a or 10d) are electrically connected in series to the first light-emitting elements (A2 or A5) of the second light- emitting area (10b or 10e), the first light-emitting elements (A2 or A5) of the second light emitting area (10b or 10e) are electrically connected in series to the first light-emitting elements (A3 or A6) of the third light-emitting area (10c or 10f, the first light-emitting elements (A3 or A6) of the third light-emitting area (10c or 10f are electrically connected in series to the second light-emitting elements (B3 or B6) of the third light-emitting area (10c or 100, the second light- emitting elements (B3 or B6) of the third light-emitting area (10c or 10f are electrically connected in series to the second light-emitting elements (B2 or B5) of the second light-emitting area (10b or 10e), and the second light-emitting elements (B2 or B5) of the second light-emitting area (10b or 10e) are electrically connected in series to the second light-emitting elements (B1 or B4) of the first light-emitting area (10a or 10d).

Same reference numbers shown in FIG. 9 mean the same elements as those mentioned in other embodiments, and redundant explanation is omitted.

In the plurality of light-emitting areas 10a-10f the number of the first light-emitting elements A1-A6 in each of the first light-emitting blocks 3 is the same with one another of the first light-emitting blocks 3 and the number of the second light-emitting elements B1-B6 in each of the second light-emitting blocks 4 is the same with one another of the second light-emitting blocks 4. Accordingly, the light-emitting areas 10a-10f can emit a same or similar intensity of light with one another even when the voltage from the AC power source changes from a low voltage to a high voltage or from a high voltage to a low voltage.

As mentioned above, according to the present invention, even when only the first light-emitting elements of the first light-emitting block are lighted by the AC drive, and even when the first light-emitting elements of the first light-emitting block and the second light-emitting elements of the second light-emitting block are together lighted by the AC drive, illumination light of each light-emitting area has constantly the same brightness, and each light-emitting element in each light-emitting area has the same service life.

Although the some embodiments of the present invention have been described, it should be understood that the present invention is not limited to these embodiments, various modifications and changes can be made to the embodiments.

Industrial Applicability

In the embodiments as mentioned above, although the present invention is applied to the light-emitting device using the light-emitting diode elements as the light-emitting elements, the present invention may be applied to a light-emitting device using light-emitting elements other than the light-emitting diode elements.

Cross-Reference to Related Application

This application is based on and claims the priority benefit of Japanese Patent Application No. 2010-294507, filed on Dec. 29, 2010, the disclosure of which is incorporated herein by reference in its entirety.

REFERENCE SIGNS LIST 1 light-emitting element
2a first electrode
2b second electrode
2c third electrode
3, 23 first light-emitting block
4, 24 second light-emitting block
10, 20 light-emitting device
10a, 10d, 20a first light-emitting area
10b, 10e, 20b second light-emitting area
10c, 10f, 20c third light-emitting area
20d forth light-emitting area
11 power source
12 AC power source
13 rectifier
13a, 13b power source terminals
15 voltage level detecting circuit
16 switching circuit
16a first switch
16b second switch
16c single switch
17 current-limiting element
30a first circuit substrate
30b second circuit substrate
30c third circuit substrate
50 metal plate
60, 70, 80 control circuit
100 street light
101, 201 support
102, 202 casing
102a space
102b, 202b first end portion
102c, 202c second end portion
200 illumination device
203 pillars
A1, A2, A3, A4, A5, A6 first light-emitting elements
B1, B2, B3, B4, B5, B6 second light-emitting elements

The invention claimed is:

1. A light-emitting device comprising:
a first light-emitting area including a first light-emitting block that comprises first light-emitting elements electrically connected in series to one another and a second light-emitting block that comprises second light-emitting elements electrically connected in series to one another;
a first circuit substrate, the first light-emitting elements and the second light-emitting elements of the first light-emitting area being mounted on the first circuit substrate;
a second light-emitting area including a first light-emitting block that comprises first light-emitting elements electrically connected in series to one another and a second light-emitting block that comprises second light-emitting elements electrically connected in series to one another;
a second circuit substrate, the first light-emitting elements and the second light-emitting elements of the second light-emitting area being disposed on the second circuit substrate;
a third light-emitting area including a first light-emitting block that comprises first light-emitting elements electrically connected in series to one another and a second light-emitting block that comprises second light-emitting elements electrically connected in series to one another; and
a third circuit substrate, the first light-emitting elements and the second light-emitting elements of the third light-emitting area being disposed on the third circuit substrate, wherein
the first light-emitting elements are configured to start to emit light with a voltage that is switched to apply to the first light-emitting elements by a control circuit when the voltage originating from an alternate current of a power source reaches a first voltage value, and
the second light-emitting elements are configured to start to emit light with the voltage that is switched to apply to both of the first light-emitting elements and the second light-emitting elements by the control circuit while the voltage originating from the alternate current of the power source reaches and surpasses a second voltage value that is higher than the first voltage value.

2. The light-emitting device of claim 1,
wherein the first light-emitting elements of the first light-emitting area, the first light-emitting elements of the second light-emitting area, and the first light-emitting elements of the third light-emitting area are electrically connected in series to one another, and the second light-emitting elements of the first light-emitting area, the second light-emitting elements of the second light-emitting area, and the second light-emitting elements of the third light-emitting area are electrically connected in series to one another.

3. The light-emitting device of claim 2, further comprising:
a casing including a first surface, a second surface, and a third surface, wherein
the first light-emitting area is disposed at the first surface of the casing,
the second light-emitting area is disposed at the second surface of the casing, and
the third light-emitting area is disposed at the third surface of the casing.

4. The light-emitting device of claim 3,
wherein a same number of the first light-emitting elements are arranged in each of the first light-emitting area, the second light-emitting area, and the third light-emitting area, and
wherein a same number of the second light-emitting elements are arranged in each of the first light-emitting area, the second light-emitting area, and the third light-emitting area.

5. The light-emitting device of claim 3, wherein
the first surface and the second surface are disposed with a first angle between the first surface and the second surface, and
the second surface and the third surface are disposed with a second angle between the second surface and the third surface.

6. The light-emitting device of claim 1,
wherein the first circuit substrate includes a metal plate and the first light-emitting elements and the second light-emitting elements of the first light-emitting area are thermally connected to the metal plate.

7. The light-emitting device of claim 1,
wherein a number of the first light-emitting elements and a number of the second light-emitting elements arranged in the first, second, and third light-emitting areas are different from one another.

8. The light-emitting device of claim 1, further comprising:
a rectifier that is electrically connectable to the power source to rectify an alternate current voltage of the power source and supply the voltage that is rectified to the first light-emitting elements and the second light-emitting elements through the control circuit.

9. The light-emitting device of claim 1,
wherein the first light-emitting elements and the second light-emitting elements are light-emitting diode elements.

10. The light-emitting device comprising:
a first light-emitting area including a first light-emitting block that comprises first light-emitting elements electrically connected in series to one another and a second light-emitting block that comprises second light-emitting elements electrically connected in series to one another; and
a first circuit substrate, the first light-emitting elements and the second light-emitting elements of the first light-emitting area being mounted on the first circuit substrate, wherein the first light-emitting elements are configured to start to emit light with a voltage that is switched to apply to the first light-emitting elements by a control circuit when the voltage originating from an alternate current of a power source reaches a first voltage value,
the second light-emitting elements are configured to start to emit light with the voltage that is switched to apply to both of the first light-emitting elements and the second light-emitting elements by the control circuit while the voltage originating from the alternate current of the power source reaches and surpasses a second voltage value that is higher than the first voltage value, and
the first circuit substrate includes a metal plate and the first light-emitting elements and the second light-emitting elements of the first light-emitting area are thermally connected to the metal plate.

11. The light-emitting device of claim 10, further comprising:
a second light-emitting area including a first light-emitting block that comprises first light-emitting elements electrically connected in series to one another and a second light-emitting block that comprises second light-emitting elements electrically connected in series to one another;
a third light-emitting area including a first light-emitting block that comprises first light-emitting elements electrically connected in series to one another and a second light-emitting block that comprises second light-emitting elements electrically connected in series to one another;
a second circuit substrate, the first light-emitting elements and the second light-emitting elements of the second light-emitting area being disposed on the second circuit substrate; and
a third circuit substrate, the first light-emitting elements and the second light-emitting elements of the third light-emitting area being disposed on the third circuit substrate.

12. A light-emitting device comprising:
a plurality of light-emitting areas each including a first light-emitting block that comprises a plurality of first light-emitting elements and a second light-emitting block that comprises a plurality of second light-emitting elements; and
a control circuit including a first switch to supply a voltage to the first light-emitting elements in the first light-emitting blocks and a second switch to supply a voltage to the second light-emitting elements as well as the first light-emitting elements, wherein
the control circuit is configured to detect a value of a voltage rectified from an alternate current voltage of an alternate current power source and to switch the first switch to apply the voltage to the first light-emitting elements arranged in the first light-emitting blocks while the voltage being supplied from the alternate current power source reaches and surpasses a first voltage value,
the control circuit is configured to switch the second switch to apply a voltage to the second light-emitting elements of the second light-emitting blocks as well as the first light-emitting elements in the first light-emitting blocks while the voltage being supplied from the alternate current power source reaches and surpasses a second voltage value that is higher than the first voltage value, and
a same number of the first light-emitting elements are arranged in each of the first light-emitting blocks and a same number of the second light-emitting elements are arranged in each of the second light-emitting blocks.

13. The light-emitting device of claim 12,
wherein the first light-emitting elements of the first light-emitting blocks are electrically connected in series to a first electrode and a second electrode, and
wherein the second light-emitting elements of the second light-emitting blocks are electrically connected in series to the second electrode and a third electrode.

14. The light-emitting device of claim 13, further comprising:
a casing including a polyhedral shape with polyhedral surfaces,
wherein the light-emitting areas are arranged on at least some of the polyhedral surfaces of the casing.

15. The light-emitting device of claim 14, further comprising:
a support, wherein
the casing includes a first end portion and a second end portion laterally opposite to each other, the light-emitting areas are disposed at the first end portion of the casing, and the support supports the casing at the second end portion of the casing.

16. The light-emitting device of claim 14, further comprising:
a support, wherein
the casing includes a first end portion and a second end portion vertically opposite to each other, and peripheral surfaces between the first end portion and the second end portion,
the light-emitting areas are disposed on at least some of the peripheral surfaces of the casing, and
the support supports the casing at the second end portion.

17. The light-emitting device of claim 16,
wherein the support includes a plurality of pillars.

18. The light-emitting device of claim 12,
wherein each of the plurality of light-emitting areas has an angle with another of the plurality of light-emitting areas.

* * * * *

UNITED STATES PATENT AND TRADEMARK OFFICE
CERTIFICATE OF CORRECTION

PATENT NO.         : 9,241,383 B2                                   Page 1 of 1
APPLICATION NO.    : 13/822792
DATED              : January 19, 2016
INVENTOR(S)        : Takakazu Yano It is certified that error appears in the above-identified patent and that said Letters Patent is hereby corrected as shown below:

In the Claims

In column 15, line 57 (claim 10, line 1), "The" should read --A--.

Signed and Sealed this
Twenty-sixth Day of April, 2016

Michelle K. Lee
*Director of the United States Patent and Trademark Office*